United States Patent [19]

Nakaoka et al.

[11] Patent Number: 5,757,711
[45] Date of Patent: May 26, 1998

[54] AMPLIFIER CIRCUIT AND COMPLEMENTARY AMPLIFIER CIRCUIT WITH LIMITING FUNCTION FOR OUTPUT LOWER LIMIT

[75] Inventors: Yoshito Nakaoka; Kiyohiro Furutani; Mikio Asakura, all of Hyogo, Japan

[73] Assignee: Mitsubishi Denki Kabushiki Kaisha, Tokyo, Japan

[21] Appl. No.: 681,431

[22] Filed: Jul. 23, 1996

[30] Foreign Application Priority Data

Nov. 29, 1995 [JP] Japan ................. 7-333904

[51] Int. Cl.$^6$ ............................................. G11C 7/02
[52] U.S. Cl. .................. 365/207; 365/203; 365/205; 365/189.07; 327/52
[58] Field of Search .................... 365/205, 203, 365/207, 189.07, 190; 327/52

[56] References Cited

U.S. PATENT DOCUMENTS

| | | |
|---|---|---|
| 5,504,443 | 4/1996 | Gross et al. .................. 365/207 X |
| 5,519,662 | 5/1996 | Ishibashi et al. ................ 365/207 |
| 5,581,511 | 12/1996 | Gaultier et al. ................ 365/207 |

FOREIGN PATENT DOCUMENTS

| | | |
|---|---|---|
| 60-131695 | 7/1985 | Japan . |
| 63-128811 | 6/1988 | Japan . |

*Primary Examiner*—David C. Nelms
*Assistant Examiner*—Huan Hoang
*Attorney, Agent, or Firm*—Lowe, Price, LeBlanc & Becker

[57] ABSTRACT

The potential of a data line is precharged to an H level by a P channel MOS transistor rendered conductive by a precharge signal. The potential of the data line is not driven by a differential amplifier circuit until the difference between the potential of the output of the differential amplifier circuit providing a corresponding signal and the potential (H level) of the data line become the level of a threshold voltage Vth(n) of an N channel MOS transistor. Therefore, erroneous data will not be provided to the data line even in the case of insufficient equalization of an I/O line pair or when there is an offset in the differential amplifier circuit.

16 Claims, 9 Drawing Sheets

AMPLIFIER CIRCUIT AND COMPLEMENTARY AMPLIFIER CIRCUIT WITH LIMITING FUNCTION FOR OUTPUT LOWER LIMIT

BACKGROUND OF THE INVENTION

1. Field of the Invention

The present invention relates to an amplifier circuit for amplifying a read out signal corresponding to stored information read out from a memory cell in a dynamic semiconductor memory device, and more particularly to a structure of an amplifier circuit for receiving complementary input signals corresponding to information read out from a memory cell and transmitting the same as small amplitude complementary signals to an output buffer circuit.

2. Description of the Background Art

FIG. 18 is a block diagram schematically showing a structure of a conventional readout related circuit 500 for receiving potentials of an I/O line pair through which signals according to stored information read out from a memory cell are transmitted as complementary signals, and providing the same as a corresponding signal DAT.

Referring to FIG. 18, a conventional readout related circuit 500 includes an I/O line pair equalize circuit 508 for electrically short-circuiting a pair of I/O lines of which the potential is altered according to information data read out from a corresponding memory cell in response to activation of an equalize signal EQi, I/O line precharge circuits 504 and 506 for precharging the I/O line pair to a predetermined potential according to an I/O line precharge signal PRi, and a preamplifier circuit 502 activated in response to a preamplifier activation signal PAEi to receive the potentials of the I/O line pair for providing a corresponding signal DAT.

The operation will be described briefly hereinafter with reference to the timing chart of FIG. 19.

Referring to FIG. 19, at time t0, the I/O line pair is forced to be short-circuited by equalize signal EQi attaining an H level (logical high). Here, the potential of the I/O line pair is precharged by the I/O line precharge circuit to a potential level which is a power supply potential $V_{DD}$ minus the threshold value $Vth(n)$ of the N channel MOS transistor forming I/O line precharge circuits 504 and 506, i.e. precharged to $V_{DD}-Vth(n)$.

At time t1, equalize signal EQi of the I/O line pair is pulled down to an L level (logical low), whereby the potentials of the I/O line pair begin to change in response to data read out from a memory cell selected by an external address signal being amplified by a sense amplifier (not shown) and output as complementary signals. More specifically, the potential of one of the I/O lines of the pair begins to be lowered from the level of the precharge potential $V_{DD}-Vth(n)$ according to the readout data.

At time t2 in response to preamplifier activation signal PAEi attaining an H level, preamplifier circuit 502 is activated to provide readout data DAT according to the potentials of the I/O line pair which is the input signal. Here, signal DAT attains an L level corresponding to the readout data being 0.

When a predetermined time T2 elapses from time $t_1$ where equalize signal EQi attains an L level to result in a sufficient value of the potential difference between the I/O lines, i.e. at time t2, signal PAEi that activates the preamplifier is pulled up to an H level. This operation is required to prevent the signal output from preamplifier circuit P/A from being erroneous data not corresponding to the input signal due to an offset voltage generated by asymmetry of the structure of preamplifier circuit P/A and variation in the manufacture process. This erroneous operation may also be caused by insufficient equalization of the I/O line pair. In this case, amplification of data (invalid data) erroneous to an input signal will be carried out.

The above-described erroneous operation caused by offset of preamplifier circuit P/A and amplification of invalid data do not result in damage of data for the preamplifier that is operating as a static circuit. However, extra time will be required until the output data is stabilized. This is one factor that degrades the access time of a dynamic semiconductor memory device. Furthermore, the requirement of time margin for activation of the preamplifier after the potential difference between the I/O line pair becomes sufficient is also one factor that delays the access of a dynamic semiconductor memory device.

At time t3, I/O line pair equalize signal EQi attains an H level, whereby the potentials of the pair of I/O lines are recovered to the same potential level of $V_{DD}-Vth(n)$. At time t4, the potential of one of the I/O lines begins to become lower than the precharged potential level according to the readout data from the memory cell selected according to an external address signal.

At time t5 corresponding to an elapse of a predetermined time margin of T2 from time t4, preamplifier circuit P/A is activated in response to preamplifier activation signal PAEi driven to an H level. In this case, data DAT output from preamplifier circuit P/A attains an H level corresponding to a readout data of 1.

At time t6, preamplifier activation signal PAEi is pulled down to an L level again, whereby preamplifier circuit P/A is inactivated. Equalize signal EQi is pulled up to an H level, so that the potentials of the I/O line pair both return to the level of precharge potential $V_{DD}-Vth(n)$.

As described above, the presence of an offset of a constant level in preamplifier circuit P/A which is a differential amplifier is inevitable. Therefore, a predetermined time margin for activation of preamplifier circuit P/A is required to prevent erroneous operation due to invalid data being output from preamplifier circuit P/A.

In a preamplifier circuit P/A with no erroneous operation, preamplifier circuit P/A can be activated even if the potential difference between the I/O lines is 0 volt. This means that the time margin from completion of equalizing the I/O line pair until activation of preamplifier circuit P/A can be eliminated.

SUMMARY OF THE INVENTION

An object of the present invention is to provide a preamplifier circuit without erroneous operation related to output of invalid data and delay in access due to time margin, and that can operate at optimum amplify timing.

According to an aspect of the present invention, an amplifier circuit receiving complementary input signals corresponding to data read out from a memory cell to output a corresponding signal to an output data line in a dynamic semiconductor memory device includes a differential amplifier circuit, a precharge circuit, and an output potential limiting circuit.

The differential amplifier circuit provides either a first or second potential according to the complementary input signals. The precharge circuit sets the potential of the output data line as a first predetermined potential according to a precharge signal. The output potential limiting circuit receives potentials of the output data line and an output node of the differential amplifier circuit to render the output data line and the output node conductive when difference between the potential of the output node and the first predetermined potential exceeds a predetermined value.

According to another aspect of the present invention, a complementary amplifier circuit receiving complementary input signals corresponding to data read out from a memory cell to output corresponding complementary output signals to first and second output data lines includes a complementary differential amplifier circuit, a precharge circuit, a first output potential limiting circuit, a second output potential limiting circuit, a first output potential maintaining circuit, and a second output potential maintaining circuit.

The complementary differential amplifier circuit receives complementary input signals, and includes first and second output nodes for providing corresponding first and second potentials complementary to each other. The precharge circuit responds to a precharge signal to set the potentials of the first and second output data lines to a first predetermined potential. The first output potential limiting circuit is connected between the first output node and the first output data line. The second output potential limiting circuit is connected between the second output node and the second output data line. The first and second output potential limiting circuits receive the potentials of the first and second output nodes, respectively, to be rendered conductive when the difference between the potential of a corresponding output node and the first predetermined potential exceeds a predetermined value. The first output potential maintaining circuit maintains the potential of the first output data line at a second predetermined potential according to the second output node attaining the second potential. The second output potential maintaining circuit maintains the potential of the second output line at the second predetermined potential according to the first output node attaining the second potential.

According to a further aspect of the present invention, an amplifier circuit for receiving an input signal corresponding to data read out from a memory cell to provide a corresponding output signal to an output data line in a dynamic semiconductor memory device includes a plurality of internal amplifier circuits, and an output potential limiting circuit.

The plurality of internal amplifier circuits are connected to each other in a cascade manner to receive the input signal and provide an amplified signal as the output signal. The output potential limiting circuit is connected between at least one pair of the plurality of internal amplifier circuits to be rendered conductive when the difference between the output potential of the internal amplifier circuit of the preceding stage and the predetermined potential exceeds a predetermined value.

Therefore, a main advantage of the present invention is that a preamplifier circuit is provided that does not have the potential of the data line which is the output initiate transition until the potential difference between a pair of I/O lines which is the input exceeds a predetermined value. More specifically, erroneous operation due to offset and generation of amplification of invalid data caused by insufficient equalization of the I/O line pair can be prevented.

Another advantage of the present invention is that a preamplifier circuit can be provided that can prevent erroneous operation of a circuit that receives the potential of a data line as an input even when leakage current occurs in a data line that receives an output.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
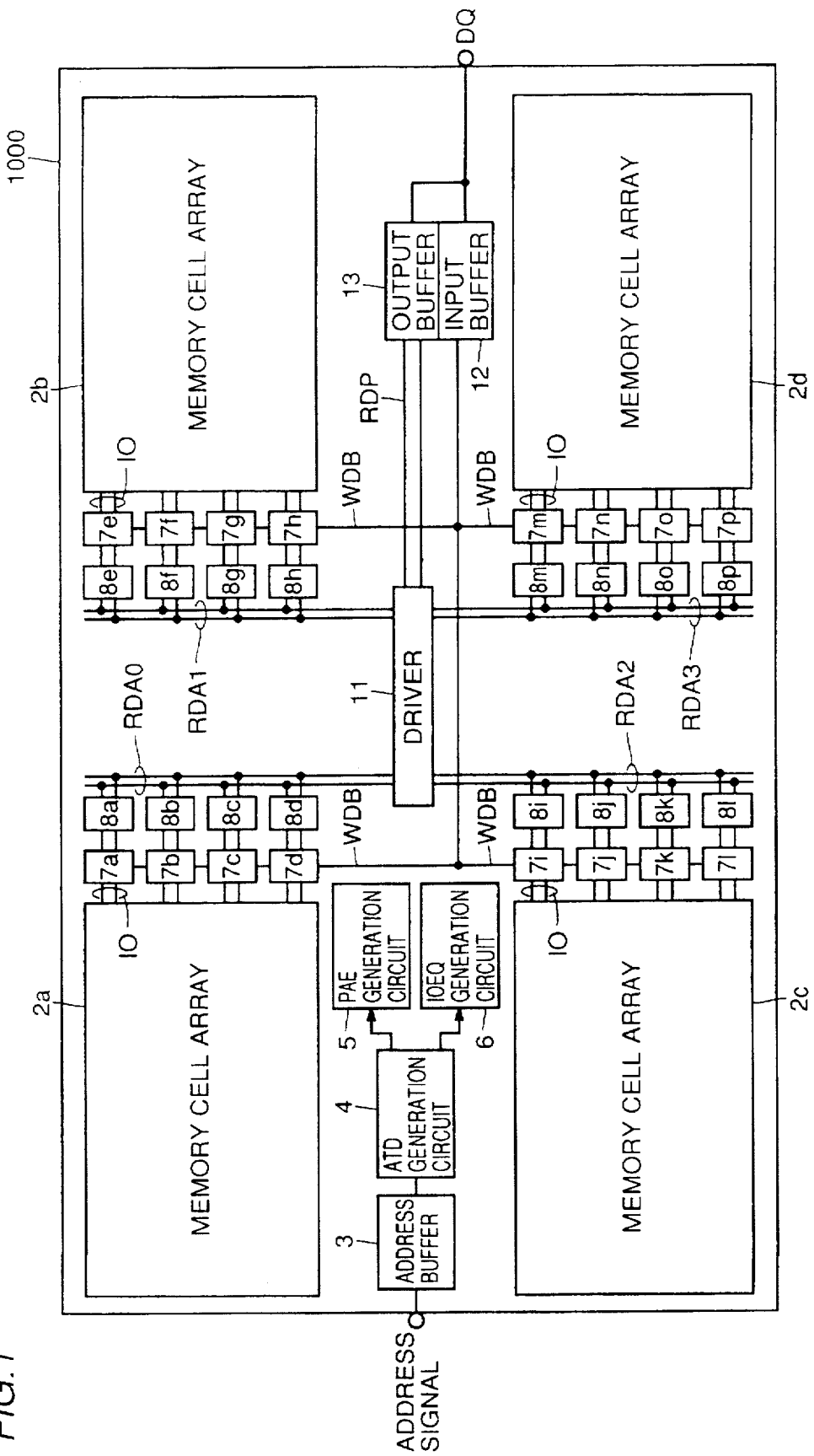
FIG. 1 is a block diagram schematically showing a structure of a semiconductor memory device 1000 according to a first embodiment of the present invention.

FIG. 1 shows a structure of a semiconductor memory device including a preamplifier circuit 100 of a first embodiment.

Semiconductor memory device 1000 includes memory cell arrays 2a–2d with memory cells arranged in a matrix for storing information, an address buffer 3 for receiving an external address signal and providing an internal address signal, an ATD generation circuit 4 for receiving an output from address buffer 3 to generate a signal (referred to as "ATD signal" hereinafter) indicating change of an address signal, a PAE generation circuit 5 receiving an ATD signal for providing a preamplifier activation signal, an IOEQ activation circuit 6 receiving an ATD signal for providing an I/O line pair equalize signal EQi for designating equalization of the potentials of an I/O line pair, preamplifier/write buffer circuits 7a–7p receiving information read out from a memory cell selected according to an external address signal for providing a readout information data signal to effect small amplitude signal transmission, and operating as a write buffer in writing data into a memory cell selected according to an internal address signal, read driver circuits 8a–8b receiving data readout from preamplifier/write buffer circuits 7a–7p and providing the same to internal data readout lines RDA0-RDA3, a driver circuit 11 receiving readout data transmitted through internal data readout lines RDA0–RDA3 to drive the potential of a data readout line RDP, an output buffer circuit 13 for receiving readout data transmitted through data readout line RDP and providing the same to a data input/output terminal DQ, and an input buffer circuit 12 for receiving an externally applied data via data input/output terminal DQ for driving the potential of a data write line WDB.

According to the above-described structure, data read out from a memory cell in, for example, memory cell array 2a is transmitted as complementary signals by an I/O line pair to be amplified by preamplifier circuit 7a. Read driver circuit 8a receiving the amplified data drives the potentials of an internal data readout line pair RDA0 to complementary potentials corresponding to the readout data. Driver circuit 11 receives a signal transmitted through internal data read out line pair RDA0 to drive the potential of data readout line pair RDP. Thus, the data read out from a memory cell is transferred as a small amplitude signal to output buffer 13 to improve the data readout time. The readout data transmitted by data readout line RDP is amplified to take a great amplitude in output buffer circuit 13 to be provided to input/output terminal DQ. More specifically, preamplifier/write buffer circuit 7a, read driver circuit 8a and driver circuit 11 operate as a repeater.

Figure 2:
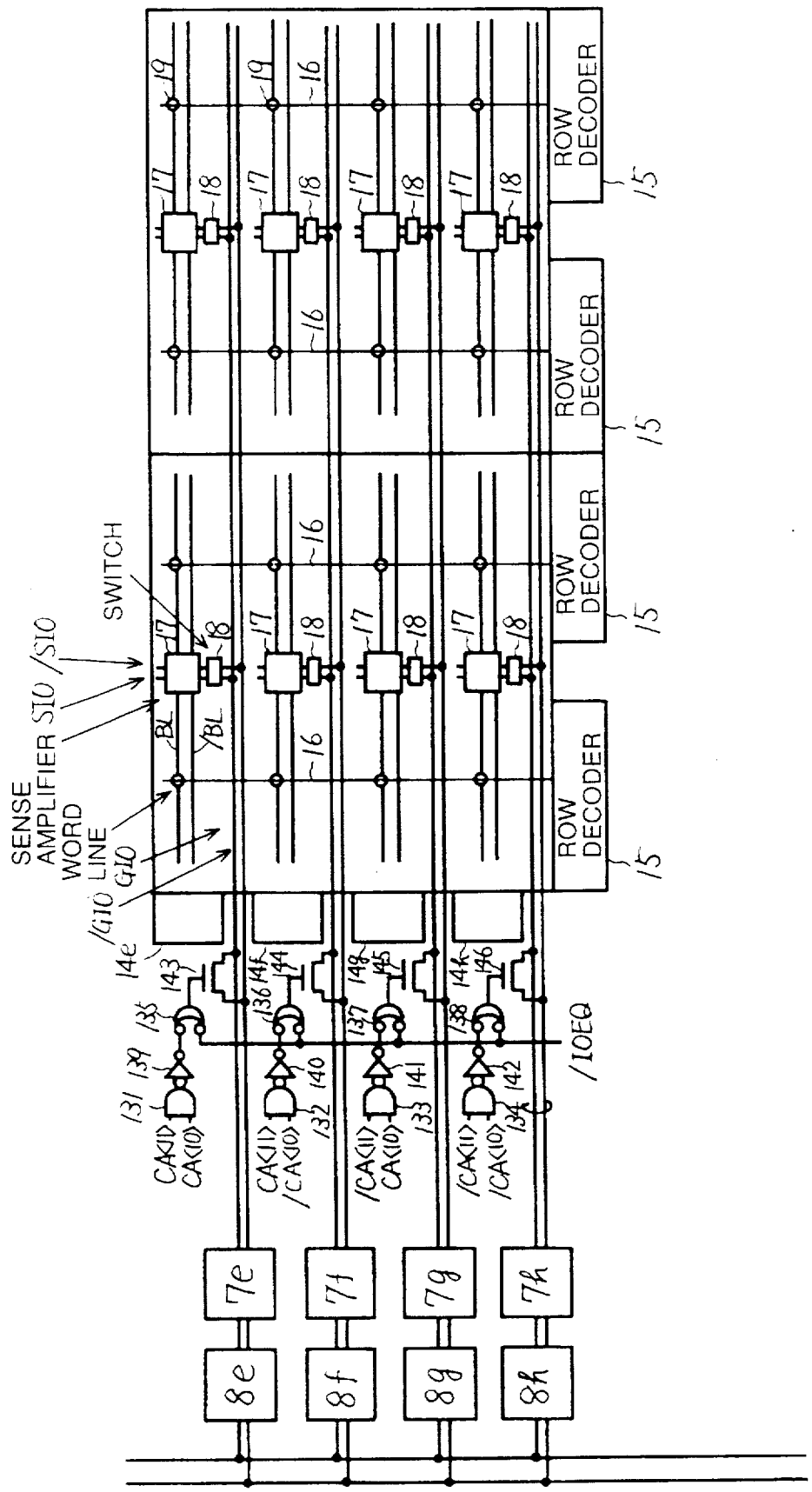
FIG. 2 is a block diagram schematically showing a structure of a memory cell array 2b of the first embodiment.

FIG. 2 shows a structure of a memory cell array 2b, and preamplifier/write buffer circuits 7e–7h and read driver circuits 8e–8h connected thereto in semiconductor memory device 1000 of FIG. 1.

Memory cell array 2b includes a row decoder 15 for selecting a corresponding word line according to an external address signal, a word line 16 driven by row decoder 15, a memory cell 19 located at a crossing between word line 16 and a pair of bit lines BL and /BL, a sense amplifier 17 for amplifying a small potential difference generated between bit lines BL and /BL in a readout operation, segment IO lines SIO and /SIO for transmitting an output of sense amplifier 17, and a switch circuit 18 for opening/closing the connection between segment IO line SIO and /SIO and between global IO lines GIO and /GIO.

Memory cell array 2b further includes a NAND circuit 131 responsive to an externally applied address signal for receiving signals CA<11> and CA<10> selecting corresponding global IO lines GIO and /GIO, an inversion circuit 139 for receiving an output of NAND circuit 131, an AND circuit 135 for receiving an output of inversion circuit 139 and I/O line pair equalize signal EQi, and an N channel MOS transistor 143 responsive to an output of AND circuit 135 for short-circuiting global IO line pair GIO and /GIO to carry out an equalize operation.

The readout data transmitted by the pair of global IO lines GIO and /GIO equalized by N channel MOS transistor 143 is amplified by preamplifier/write buffer circuit 7e. The amplified data is transmitted to internal data readout line RDA1 by read driver circuit 8e.

In memory cell array 2b of FIG. 2, N channel MOS transistors 144–146 carrying out equalization similar to that of preamplifier/write buffer circuit 7e are provided corresponding to global IO lines GIO and /GIO connected to preamplifier/write buffer circuits 7f–7h. For example, the gate of N channel MOS transistor 144 is connected to the output of AND circuit 136 receiving internal column address signals CA<11> and /CA<10> at one input via NAND circuits 132 and 140, and signal EQi at the other input.

The operation will be described briefly hereinafter.

When ATD generation circuit 4 senses change of an external address signal and provides an ATD signal, IOEQ generation circuit 6 responds to provide equalize signal EQi. In response, internal column address signals CA<11> and CA<10> both attaining an H level (logical high) causes corresponding N channel MOS transistor 143 to be rendered conductive, whereby global IO lines GIO and /GIO are equalized.

In response to an external address signal, row decoder 15 drives a corresponding word line 16 to an H level, whereby a memory cell 19 is selected. According to the information stored in memory cell 19, a potential difference generated between bit lines BL and /BL is amplified by sense amplifier 17 to be output to segment IO lines SIO and /SIO.

In response to inactivation of I/O line pair equalize signal EQi, N channel MOS transistor 143 is cut off, and switch circuit 18 conducts. The potential difference generated between the pair of segment IO lines SIO and /SIO is transmitted to the pair of global IO lines GIO and /GIO. The potential difference between the pair of global IO lines GIO and /GIO is amplified by preamplifier/write buffer circuit 7e.

The readout data amplified by preamplifier/write buffer circuit 7e is transmitted to an internal data readout line pair RDA1 by read driver circuit 8e to be further transmitted to a data readout line pair RDP by driver circuit 11. Output buffer circuit 3 provides a corresponding output signal to an input/output terminal DQ according to the potential difference of data readout line pair RDP.

In the above readout operation, a structure was described for transmitting data read out from a memory cell as small amplitude complementary signals by multiple stage transmission to output buffer circuit 13. However, the method of transmitting a readout data to an output buffer circuit is not limited to the above-described readout data lines of a complementary structure, and can be transmitted by one data line, i.e. the so-called single data line.

A structure of a preamplifier circuit 100 receiving a potential difference of an I/O line pair for driving the potential of a single data line DATA to a corresponding potential level will be described according to a first embodiment of the present invention.

Figure 3:
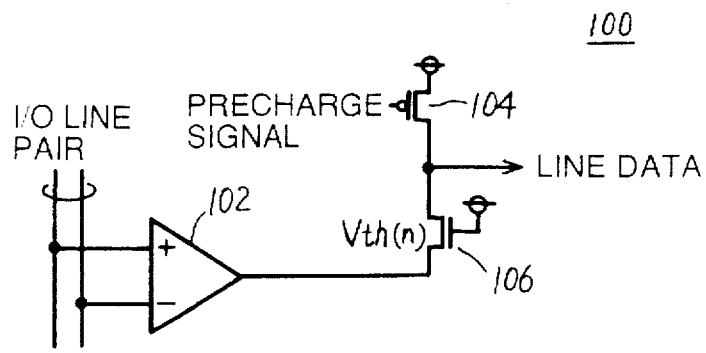
FIG. 3 is a circuit diagram showing a structure of a preamplifier circuit 100 of the first embodiment.

Referring to FIG. 3, a preamplifier circuit 100 includes a differential amplifier circuit 102 for receiving an I/O line pair as inputs, an N channel MOS transistor 106 connected between an output of differential amplifier circuit 102 and a line DATA, and receiving power supply potential $V_{DD}$ at its gate, and a P channel MOS transistor 104 connected between power supply potential $V_{DD}$ and a data line DATA, and receiving a precharge signal at its gate.

First, line DATA is precharged to an H level, i.e. to potential $V_{DD}$ according to P channel MOS transistor 104 rendered conductive in response to a precharge signal.

When the potential of differential amplifier circuit 102 attains an H level in response to potential change of the I/O line pair according to readout data, N channel MOS transistor 106 is cut off. Therefore, the potential of the line DATA is maintained at an H level.

When the output level of differential amplifier circuit 102 attains an L level, N channel MOS transistor 106 conducts, whereby the charge in the line DATA is discharged. Therefore, the potential of line DATA shows a transition to an L level.

The following relationship must be satisfied for N channel MOS transistor 106 to conduct.

$$\text{Vout} < V_{DD} - \text{Vth(n)} \qquad (1)$$

where Vth(n) is the threshold voltage of N channel MOS transistor 106, and Vout is the potential level of the output signal of differential amplifier circuit 102.

More specifically, N channel MOS transistor 106 is cut off and the potential of line DATA will be retained at the H level when output Vout of differential amplifier circuit 102 is within the range of:

$$V_{DD} - \text{Vth(n)} < \text{Vout} \leq V_{DD} \qquad (2)$$

Even if there is an offset due to asymmetry of the structure of differential amplifier circuit 102 and variation in the manufacturing process, i.e. even when the potential difference of the I/O line pair is sufficiently low and the output of differential amplifier circuit 102 is inverted with respect to the readout data, the data on line DATA does not change until the difference of the potentials between line DATA and differential amplifier circuit 102 exceeds threshold voltage Vth(n) of N channel MOS transistor 106.

Therefore, the potential of line DATA will not begin to change until the potential difference of the pair of I/O lines become higher than a predetermined value corresponding to readout data. More specifically, erroneous operation due to offset and generation of amplification of invalid data caused by insufficient equalization of the pair of I/O lines can be prevented by means of the structure of preamplifier circuit 100.

Figure 4:
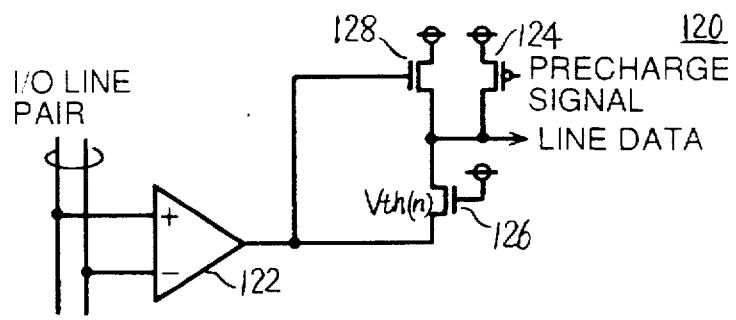
FIG. 4 is a circuit diagram showing a structure of a preamplifier circuit 120 which is a first modification of the first embodiment.

FIG. 4 is a modification of preamplifier circuit 100 of the first embodiment.

When line DATA is precharged and the charge in line DATA is discharged due to some cause in preamplifier circuit 100, there is a possibility of the circuit that receives the potential of line DATA as an input sensing transition in the potential of line DATA due to the leakage current to operate erroneously.

Preamplifier circuit 120 of the present modification includes an N channel MOS transistor 128 to prevent line DATA from attaining a complete floating state electrically when precharging of line DATA is completed.

More specifically, preamplifier circuit 120 includes, in addition to the structure of preamplifier circuit 100, N channel MOS transistor 128 connected between line DATA and power supply potential $V_{DD}$ to receive an output of differential amplifier circuit 122 at its gate.

According to this structure, when the output of line DATA becomes lower than $V_{DD}$-Vth where Vth is the threshold voltage of N channel MOS transistor 128 while differential amplifier circuit 122 provides a signal of an H level, N channel MOS transistor 128 conducts to charge line DATA. Therefore, the potential of line DATA will not become lower than $V_{DD}$-Vth.

When the output potential of differential amplifier circuit 122 attains an L level, N channel MOS transistor 128 is constantly cut off. In this case, leakage in line DATA to cause the potential level thereof drop towards the L level is of no problem since the level of the potentials to be output both attain an L level.

By virtue of the structure of preamplifier circuit 120, erroneous operation of the circuit that receives the potential of data line DATA as an input is prevented even when leakage current occurs in line DATA.

A structure of a preamplifier circuit for providing data to a single data line DATA was described above. In the following, a modification of the above structure applied to a preamplifier circuit providing complementary data will be described hereinafter.

Figure 5:
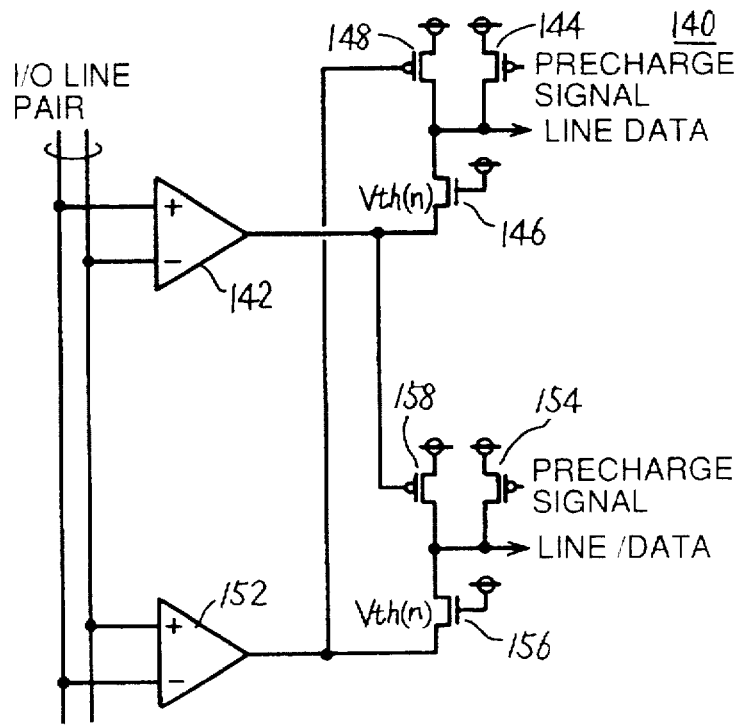
FIG. 5 is a circuit diagram showing a structure of a preamplifier circuit 140 which is a second modification of the first embodiment.

Referring to FIG. 5, a preamplifier circuit 140 includes a differential amplifier circuit 142 for receiving the potentials of a pair of I/O lines as inputs, an N channel MOS transistor 146 connected between differential amplifier circuit 142 and line DATA to receive power supply potential $V_{DD}$ at its gate, a P channel MOS transistor 144 connected between line DATA and power supply potential $V_{DD}$ to receive a precharge signal at its gate, a differential amplifier circuit 152 for receiving the potential of the pair of I/O lines as inputs, an N channel MOS transistor 156 connected between an output of differential amplifier circuit 152 and a data line /DATA for receiving power supply potential $V_{DD}$ at its gate, a P channel MOS transistor 154 connected between line /DATA and power supply potential $V_{DD}$ to receive a precharge signal at its gate, a P channel MOS transistor 148 connected between power supply potential $V_{DD}$ and line DATA to receive an output of differential amplifier circuit 152 at its gate, and a P channel MOS transistor 158 connected between power supply potential $V_{DD}$ and line /DATA to receive an output of differential amplifier circuit 142 at its gate.

In other words, preamplifier circuit 140 has a structure in which two of preamplifier circuit 120 are combined symmetrically so as to attain complementary outputs provided that N channel MOS transistor 128 is substituted with respective P channel MOS transistor 148 or 158.

The potential of a corresponding line DATA or /DATA does not show a transition from the precharged level of an H level until either differential amplifier circuit 142 or 152 from which an output of an L level is to be output becomes lower than $V_{DD}$-Vth where Vth(n) is the threshold voltage of N channel MOS transistors 146 and 156 according to the potential difference between the pair of I/O lines, as in preamplifier circuit 200 of FIG. 3.

Here, it is assumed that differential amplifier circuit 142 provides an H level, and differential amplifier circuit 152 provides an L level, for example. P channel MOS transistor 148 is rendered conductive since the gate thereof is supplied with a signal of an L level, and line DATA is maintained at an H level. In contrast, P channel MOS transistor 158 receiving a signal of an H level at its gate is cut off. Therefore, the potential of line DATA is maintained at an H level even when a leakage current or the like is seen in line DATA from which a signal of an H level is to be output.

Since P channel MOS transistor 158 that opens/closes the connection between line /DATA from which a signal of an L level is to be output and power supply potential $V_{DD}$ is cut off, the potential of line /DATA begins to show a transition from the precharged potential of the H level to an L level at the end of precharging when there is a leakage current or the like in line /DATA. In this case, the presence of a leakage current is of no problem since line /DATA provides a signal of an L level.

Thus, after lines DATA and /DATA are precharged to an H level in preamplifier circuit 140, transition of the potential of line /DATA is not initiated until the output level of differential amplifier circuit 152 from which an output of an L level to be provided becomes lower than $V_{DD}$–Vth(n). In addition, the potential of line DATA receiving an output of differential amplifier circuit 142 from which an output of an H level is to be provided is maintained at an H level since P channel MOS transistor 148 conducts. Therefore, erroneous data will not be output even if a leakage current occurs in line DATA.

In contrast to the transistor in preamplifier circuit 120 holding the potential of a data line at an H level being an N channel MOS transistor, P channel MOS transistors 148 and 158 can be used in preamplifier circuit 140 taking advantage of the output of signals complementary to each other to maintain the potential of line DATA or /DATA at an H level. Therefore, the potential of line DATA or /DATA from which a signal of an H level is to be provided is maintained at an H level with no decrease from the level of power supply potential $V_{DD}$ by the threshold voltage of the transistor.

By applying preamplifier circuit 140 shown in FIG. 5 in preamplifier/write buffer circuits 7e–7h shown in FIG. 2, erroneous operation due to an offset by the asymmetry of a preamplifier and variation in the manufacturing process, and amplification of an invalid data caused by insufficient equalization of a pair of I/O lines can be prevented.

Second Embodiment

In the previous first embodiment, an N channel MOS transistor receiving power supply potential $V_{DD}$ at its gate is connected between an output of a differential amplifier circuit and a data line to prevent erroneous operation due to offset caused by asymmetry and variation in the manufacturing process, and generation of amplification of invalid data caused by insufficient equalization of a pair of I/O lines of the output from the differential amplifier circuit.

In such a structure, transition of the potential of a data line is not initiated until the difference between the potential of the data line precharged to the H level and the output potential of the differential amplifier circuit becomes greater than the threshold voltage Vth(n) of the N channel MOS transistor.

There are cases in which it is desired to set the limitation applied to the output potential to an arbitrary value in circuit designing.

The second embodiment of the present invention provides a preamplifier circuit without the restriction that the transition of the output potential must be higher than Vth(n).

Figure 6:
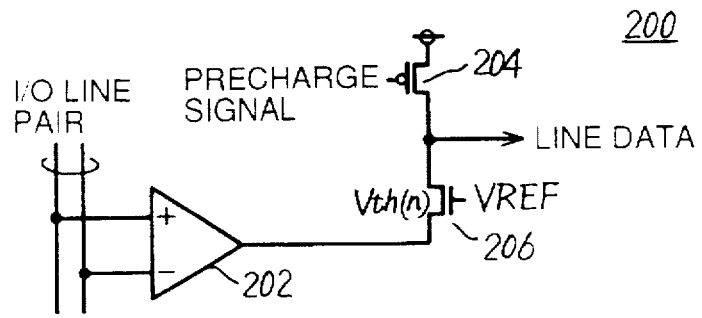
FIG. 6 is a circuit diagram showing a structure of a preamplifier circuit 200 according to a second embodiment of the present invention.

FIG. 6 is a circuit diagram showing a structure of a preamplifier circuit 200 according to the second embodiment.

Preamplifier circuit 200 includes a differential amplifier circuit 202 for receiving the potentials of an I/O line pair as inputs, an N channel MOS transistor 206 connected between an output of a differential amplifier circuit 202 and line DATA for receiving a reference potential VREF at its gate, and a P channel MOS transistor 204 connected between line DATA and power supply potential $V_{DD}$ for receiving a precharge signal at its gate.

More specifically, preamplifier circuit 200 is a modification of preamplifier circuit 100 wherein the potential received at the gate of N channel MOS transistor 106 is reference potential VREF, not power supply potential $V_{DD}$.

Here, it is assumed that:

$$VREF=V_{DD}+\Delta V \quad (3)$$

Considering that line DATA attains an H level, i.e. line DATA is precharged to power supply potential $V_{DD}$, N channel MOS transistor 206 conducts when the condition of:

$$Vth(n)<(V_{DD}+\Delta V)-Vout \quad (4)$$

is satisfied where Vth(n) is the threshold voltage of N channel MOS transistor 206, and Vout the output potential of differential amplifier circuit 202. This means that discharge of the potential of line DATA to an L level is initiated when:

$$Vout<V_{DD}-(Vth(n)-\Delta V) \quad (5)$$

It is appreciated by comparing equations (5) and (1) that the limitation on the transition of the output potential is set to (Vth(n)–ΔV) from the previous value of Vth(n), which is a lower value. Therefore, a structure can be provided in which the potential of line DATA shows a transition at a stage where the difference between line DATA and the potential of differential amplifier circuit 202 is smaller by setting potential VREF applied to the gate of N channel MOS transistor 206 greater than the level of power supply potential $V_{DD}$.

By setting potential VREF to an appropriate value according to the above-described structure, the restriction applied on the output potential of differential amplifier circuit 202 to initiate transition of the potential of line DATA can be set to an arbitrary value. Furthermore, erroneous operation caused by offset potential and amplification of invalid data can be prevented as in the first embodiment.

Although the above description is provided in which potential VREF applied to the gate of N channel MOS transistor 206 is greater than power supply potential $V_{DD}$, the limitation on the output potential of differential amplifier circuit 202 can be set higher by setting potential VREF lower than power supply potential $V_{DD}$.

Figure 7:
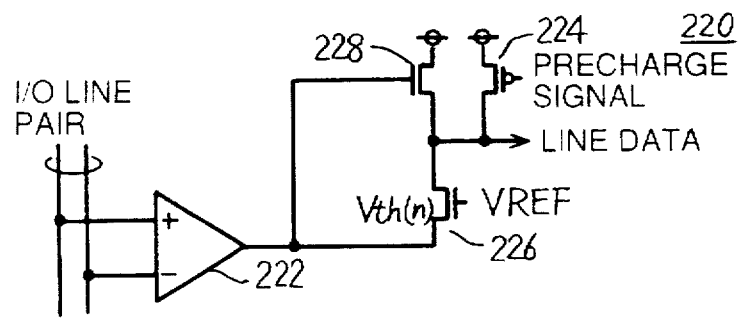
FIG. 7 is a circuit diagram showing a structure of a preamplifier circuit 220 which is a first modification of the second embodiment.

FIG. 7 shows a preamplifier circuit 220 which is a modification of preamplifier circuit 200 of the second embodiment.

Preamplifier circuit 220 has a structure similar to that of preamplifier circuit 120 of FIG. 4 provided that the potential applied to the gate of N channel MOS transistor 126 is altered to reference potential VREF from power supply potential $V_{DD}$. The remaining elements are similar to those of preamplifier circuit 120.

Accordingly, the limitation on the transition of the output potential level of differential amplifier circuit 220 required to initiate transition of the potential of line DATA can be set to an arbitrary value.

Furthermore, an N channel MOS transistor 228 is included, connected between power supply potential $V_{DD}$ and line DATA to receive an output potential of differential amplifier 222 at its gate, similar to preamplifier circuit 120 of FIG. 4. Therefore, even if a leakage current is generated in line DATA in providing an output of an H level from differential amplifier circuit 222, the potential thereof will not become lower than $V_{DD}$—Vth where Vth is the threshold voltage of N channel MOS transistor 228.

Figure 8:
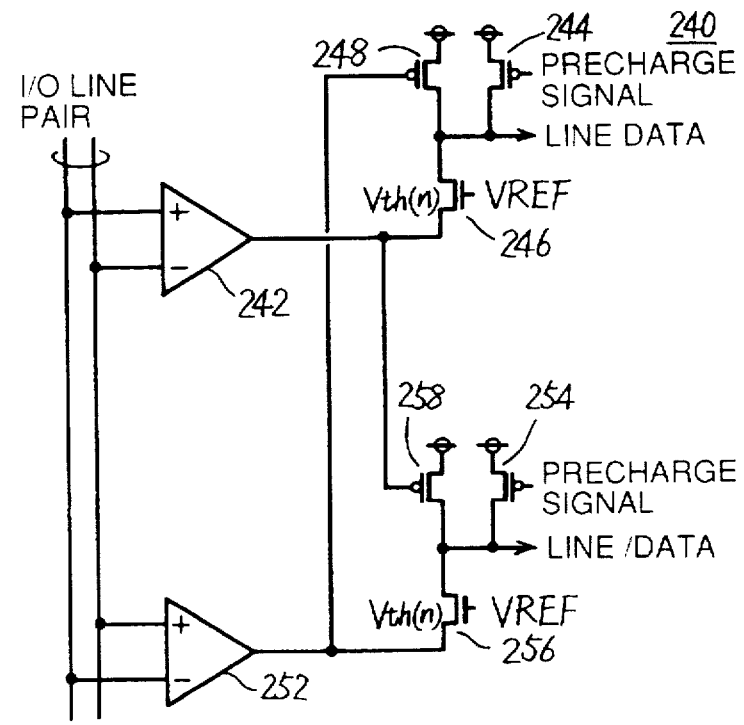
FIG. 8 is a circuit diagram showing a structure of a preamplifier circuit 240 which is a second modification of the second embodiment.

FIG. 8 is a circuit diagram showing a structure in which two preamplifier circuits 220 of FIG. 7 are combined as a pair to obtain complementary outputs.

In preamplifier circuit 240, the potential applied to the gates of N channel MOS transistors 146 and 156 is reference potential VREF, not power supply potential $V_{DD}$ with respect to the structure of preamplifier circuit 140 of FIG. 5. The remaining elements of preamplifier circuit 240 are similar to those of preamplifier circuit 140.

Therefore, in preamplifier circuit 240, the level of limitation applied on the transition of the output potential level of differential amplifier circuit 242 or 252 required for initiating transition of the potential of line DATA or /DATA from which a signal of an L level is to be output can be set to an arbitrary value.

Figure 9:
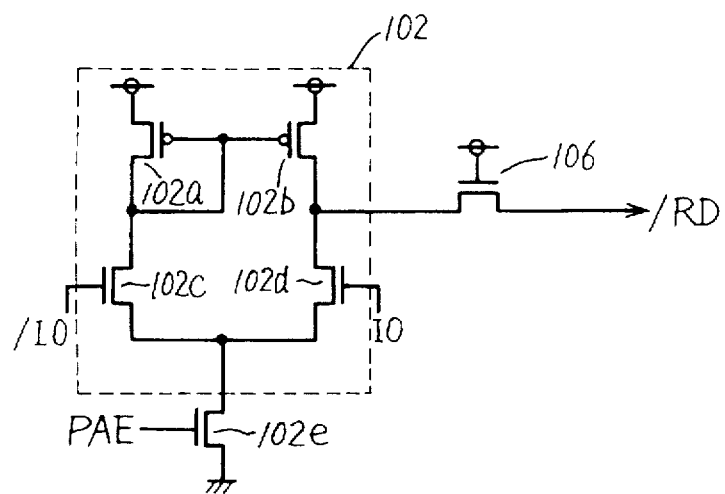
FIG. 9 is a circuit diagram showing a structure of a differential amplifier circuit.

FIG. 9 is a circuit diagram showing an example of a structure of differential amplifier circuit 102 shown in FIG. 3.

Differential amplifier circuit 102 includes P channel MOS transistors 102a and 102b having both sources connected to power supply potential $V_{DD}$, and operating as a current mirror circuit, an N channel MOS transistor 102c connected to the drain of P channel MOS transistor 102a for receiving the potential of line /IO at its gate, an N channel MOS transistor 102d having its drain connected to the drain of P channel MOS transistor 102b, and receiving the potential of line IO at its gate, and an N channel MOS transistor 102e having its drain connected to the sources of N channel MOS transistors 102c and 102d, its source connected to ground potential, and its gate supplied with a preamplifier circuit activation signal PAE.

When preamplifier activation signal PAE attains an active state (H level), equal current flows to P channel MOS transistors 102a and 102b forming a current mirror circuit. When the potential of line /IO begins to drop from an H level while the potential of line IO still attains an H level, N channel MOS transistor 102d is strongly turned on, while N channel MOS transistor 102c is weakly turned on. Since the same current flows in N channel MOS transistors 102c and 102d, the potential of the node of P and N channel MOS transistors 102b and 102d, i.e. the output potential of differential amplifier circuit 102, attains an L level.

Third Embodiment

Figure 10:
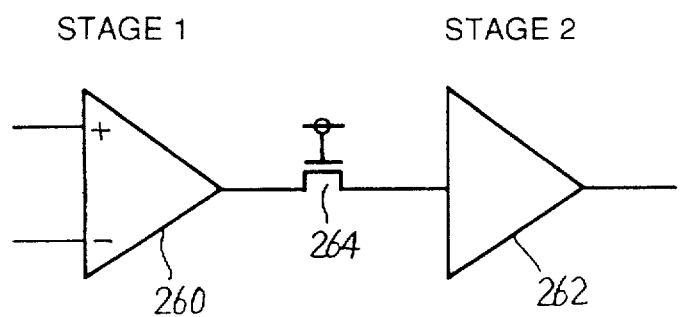
FIG. 10 is a block diagram schematically showing a structure of a third embodiment.

The previous embodiments were described in which the differential amplifier circuit is a one stage amplifier. FIG. 10 shows an embodiment in which the differential amplifier circuit includes two or more stages of cascade-connected amplifiers. More specifically, the differential amplifier circuit of FIG. 10 has a structure in which an N channel MOS transistor 264 is connected between the output of the first stage differential amplifier circuit 260 and the input of the second stage amplifier circuit 262 for limiting the amount of change in the output potential for the potential level of the output of differential amplifier circuit 260 to be transmitted to amplifier circuit 262 of the second stage.

The output potential of amplifier 262 of the second stage does not change until the output potential of differential amplifier circuit 260 shows a transition greater than the threshold voltage Vth(n) of N channel MOS transistor 264.

Similar to the first embodiment, output of erroneous data can be prevented even in the case where there is an offset due to the structure of the differential amplifier circuit and variation in the manufacturing process and in the case where equalization of the pair of I/O lines is insufficient.

[Operation of Preamplifier Circuit]

Figure 11:
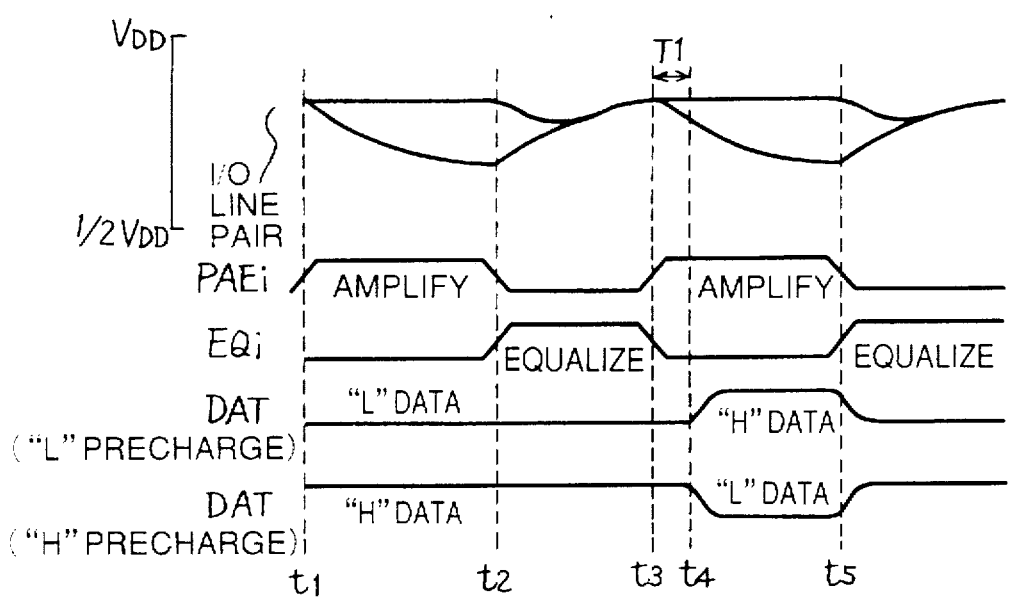
FIG. 11 is a timing chart showing an operation of a preamplifier circuit.

FIG. 11 is a timing chart of an operation of the preamplifier circuit shown in FIGS. 3–5 or FIGS. 6–8.

A case is considered in which line DATA is precharged to an H level as data signal DAT.

When preamplifier circuit activation signal PAEi is rendered active (H level) during the period of times t1–t2, data of an H level, for example, is provided to line DATA, according to change in the potential of the I/O line pair. At time t2, preamplifier circuit activation signal PAEi is rendered inactive (L level), and I/O line pair equalize signal EQi is rendered active (H level). The pair of I/O lines are precharged to have their potentials equalized.

At time t3, preamplifier activation signal PAEi attains an H level concurrent to inactivation (L level) of equalize signal EQi, whereby the change in the potential of a corresponding I/O line pair is amplified and output to line DATA as signal DAT. Since the preamplifier circuit will not output erroneous data even when the potential difference between the I/O line pair is sufficiently low in contrast to a conventional preamplifier circuit, time margin does not have to be provided between completion of an equalize operation and activation of the preamplifier circuit (activation of PAE signal). Therefore, time period T1 from the completion of an equalize operation (time t3) until time t4 where data output from line DATA is initiated is reduced in comparison to that of a conventional case.

Fourth Embodiment

The structure of a preamplifier circuit wherein a data line is precharged to an H level is described in the first embodiment. There are cases when a data line is precharged to an L level.

Figure 12:
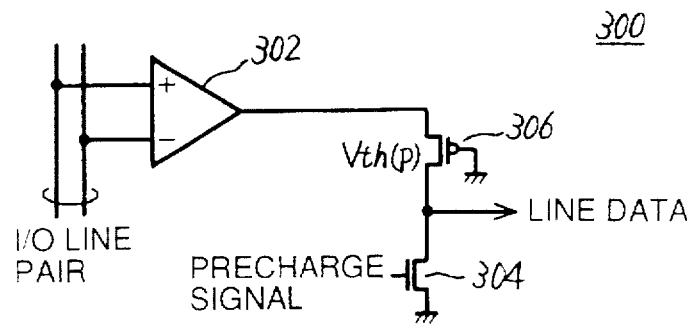
FIG. 12 is a circuit diagram showing a structure of a preamplifier circuit 300 according to a fourth embodiment of the present invention.

FIG. 12 is a circuit diagram showing a structure of a preamplifier circuit 300 according to a fourth embodiment of the present invention.

Preamplifier circuit 300 includes a differential amplifier circuit 302 for receiving potentials of an I/O line pair to output a corresponding signal, a P channel MOS transistor 306 connected between data line DATA and differential amplifier circuit 302 for receiving ground potential at its gate, and an N channel MOS transistor 304 connected between line DATA and ground potential for receiving a precharge signal at its gate.

More specifically, precharge circuit 300 has a structure similar to that of preamplifier circuit 100 shown in FIG. 3 provided that the polarity thereof is opposite. When line DATA is precharged to an L level, the potential of line DATA is driven towards an H level when the output Vout of differential amplifier circuit 302 becomes greater than the threshold voltage Vth (p) of p channel MOS transistor 306.

Thus, the amount required for a change in the output potential level of differential amplifier circuit 302 for initiating change in the potential of line DATA is limited, similar to preamplifier circuit 100 of FIG. 3.

Erroneous data will not be output since the potential of data line DATA does not change until the output potential level of differential amplifier circuit 302 becomes higher than a predetermined voltage (Vth (p)) even when there is an offset due to the structure of differential amplifier circuit 302 and variation in the manufacturing process, and even in the case where invalid data is amplified due to insufficient equalization of the I/O line pair.

Figure 13:
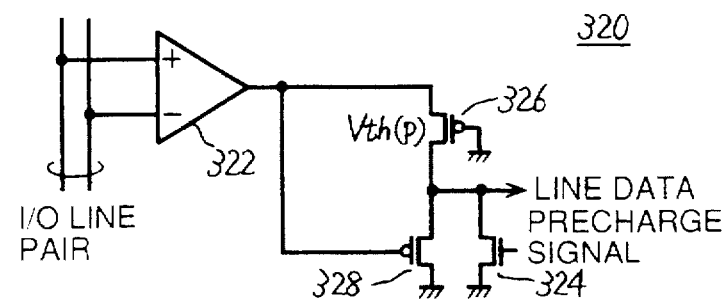
FIG. 13 is a circuit diagram showing a structure of a preamplifier circuit 320 which is a first modification of the fourth embodiment.

FIG. 13 shows a structure of a preamplifier circuit 320 which is a modification of preamplifier circuit 120 of FIG. 4 with opposite polarity. Similar to preamplifier 120, preamplifier circuit 320 has P channel MOS transistor 328 rendered conductive to suppress a further change in the potential of line DATA when it shows a transition towards an H level due to some cause while differential amplifier circuit 322 provides a signal of an L level.

Figure 14:
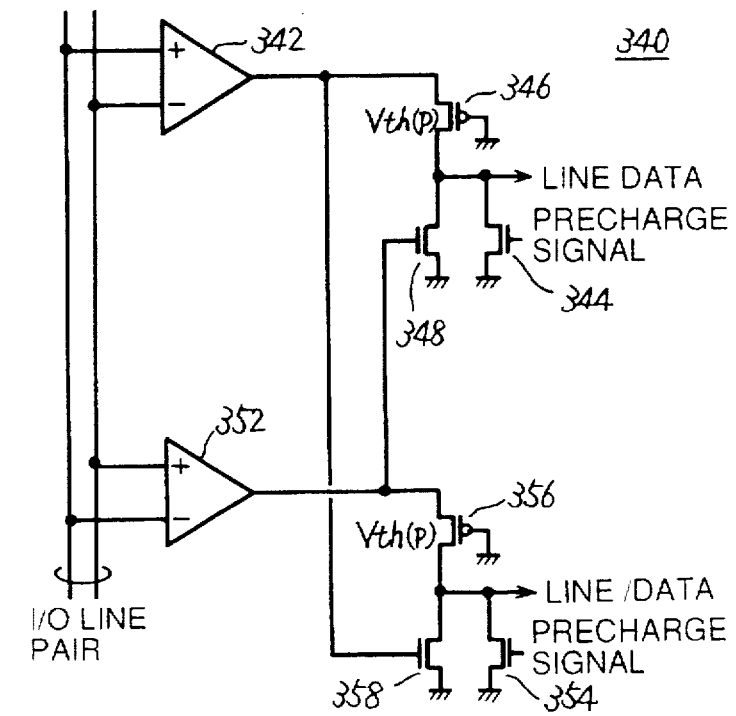
FIG. 14 is a circuit diagram showing a structure of a preamplifier circuit 340 which is a second modification of the fourth embodiment.

FIG. 14 shows a structure of a preamplifier circuit 340 which is a modification of two of preamplifier circuits 320 of FIG. 13 combined as a pair so as to output complementary data.

The structure of preamplifier circuit 340 is similar to that of preamplifier circuit 140 of FIG. 5, provided that the polarity thereof is opposite. The operation thereof is similar, so that its description will not be repeated.

Fifth Embodiment

Figure 15:
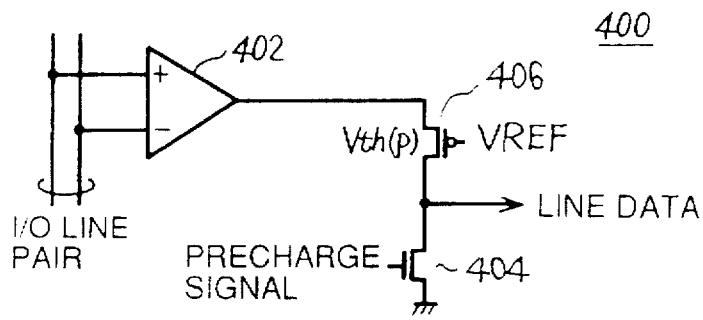
FIG. 15 is a circuit diagram showing a structure of a preamplifier circuit 400 according to a fifth embodiment of the present invention.

FIG. 15 is a circuit diagram showing a structure of a preamplifier circuit 400 according to a fifth embodiment of the present invention.

Preamplifier circuit 400 is similar to preamplifier circuit 300 of FIG. 12 provided that the potential received at the gate of P channel MOS transistor 306 is reference potential VREF, not power supply potential $V_{DD}$. The remaining elements are similar to those of preamplifier circuit 300.

P channel MOS transistor 406 is only rendered conductive so that transition of the potential of line DATA is initiated when the level of the output potential of differential amplifier circuit 402 satisfies the following condition while the potential of line DATA is precharged to an L level.

Vout−VREF>Vth (p)

This means that change in the output potential of differential amplifier circuit 402 will not appear on data line DATA until the condition of:

Vout>Vthp+VREF is satisfied. By setting an appropriate value of potential VREF, the level of limitation on the amount of change in the level of the output potential of differential amplifier circuit 402 required for initiating transition of the potential of data line DATA can be set to an arbitrary value.

Figure 16:
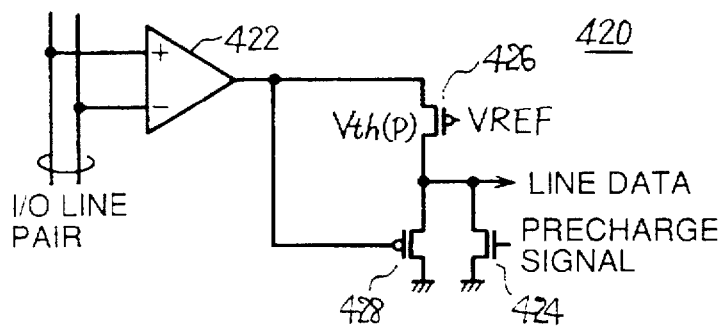
FIG. 16 is a circuit diagram showing a structure of a preamplifier circuit 420 which is a first modification of the fifth embodiment.

FIG. 16 is a circuit diagram showing a structure of a preamplifier circuit 420 which is a modification of preamplifier circuit 400.

Preamplifier circuit 420 is similar to the structure of preamplifier circuit 320 of FIG. 13 provided that the potential applied to the gate of P channel MOS transistor 326 is reference potential VREF, not the ground potential. The remaining elements are similar to those of preamplifier circuit 320.

Therefore, preamplifier circuit 420 provides advantages similar to those of preamplifier circuit 320, in addition to the advantage that the level of change in the amount of the potential level of differential amplifier circuit 422 required for changing the potential of line DATA can be set to an arbitrary value.

Figure 17:
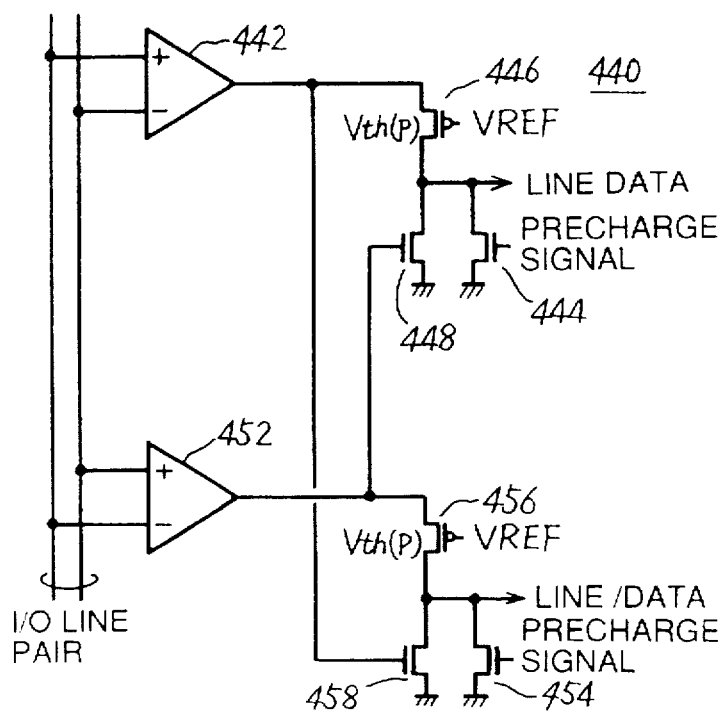
FIG. 17 is a circuit diagram showing a structure of a preamplifier circuit 440 which is a second modification of the fifth embodiment.
Figure 18:
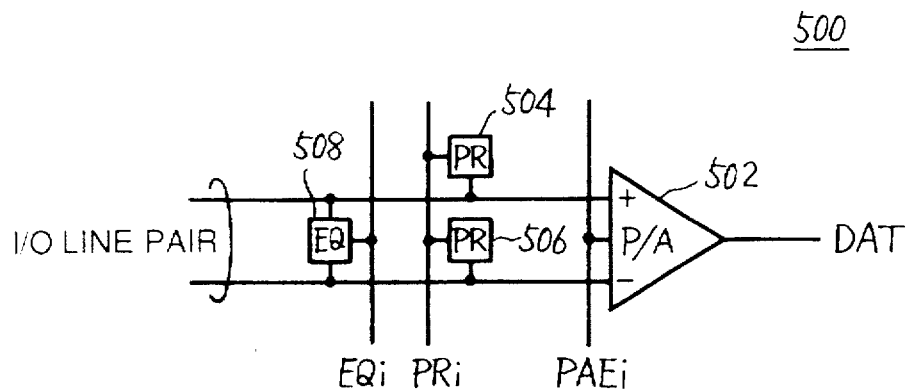
FIG. 18 is a block diagram schematically showing a structure of a conventional preamplifier circuit 500.
Figure 19:
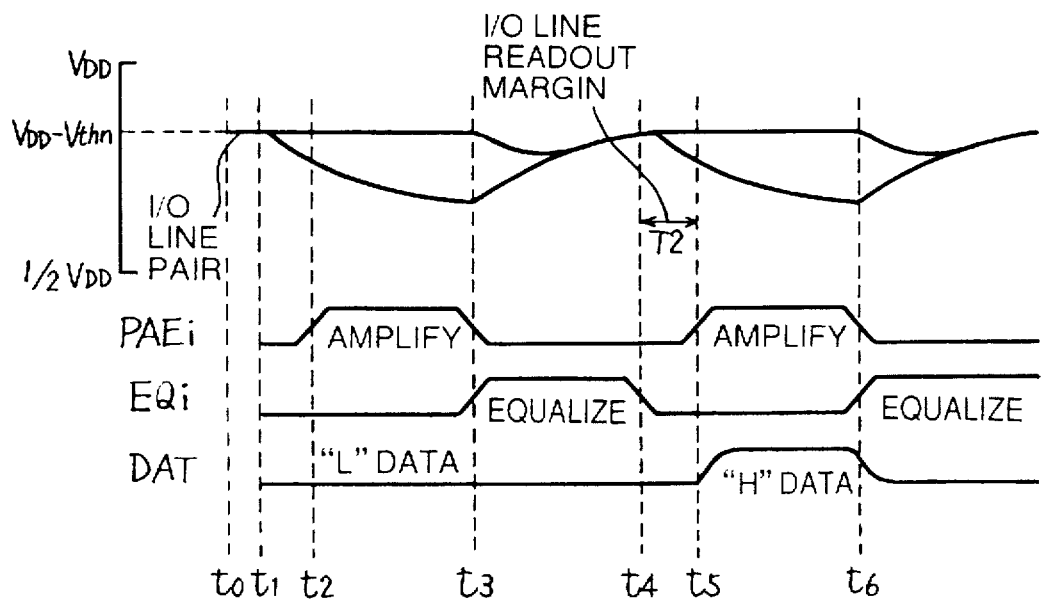
FIG. 19 is a timing chart showing an operation of a conventional preamplifier circuit.

FIG. 17 is a circuit diagram showing a structure of a preamplifier circuit 440 which is a modification of two of preamplifier circuits 420 of FIG. 16 combined as a pair so as to obtain complementary outputs.

Preamplifier circuit 440 has a structure similar to that of preamplifier circuit 340 of FIG. 14, provided that the gates of P channel MOS transistors 346 and 346 receive reference potential VREF, not the ground potential. The remaining elements are similar to those of preamplifier circuit 340.

Therefore, preamplifier circuit 440 provides advantages similar to those of preamplifier circuit 340, as well as the advantage that the amount of change of the level of the output potential of differential amplifier circuit 420 or 452 required for changing the potential of line DATA or /DATA is changed to an arbitrary value.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An amplifier circuit receiving complementary input signals corresponding to data read out from a memory cell for providing a corresponding output signal to an output data line in a dynamic semiconductor memory device, said amplifier circuit comprising:

differential amplifier means responsive to said complementary input signals for providing one of first and second potentials, precharge means responsive to a precharge signal for setting a potential of said output data line to a first predetermined potential, and output potential limiting means receiving a potential of said output data line and a potential of an output node of said differential amplifier means for rendering a path between said output data line and said output node conductive when a difference between the potential of said output node and said first predetermined potential exceeds a predetermined value.

2. The amplifier circuit according to claim 1, further comprising output potential maintaining means for maintaining the potential of said output data line at a second predetermined potential in response to the potential of said output node attaining said second potential.

3. The amplifier circuit according to claim 1, wherein said output potential limiting means comprises an MOS transistor connected between said output node and said output data line for receiving a reference potential at a gate electrode.

4. The amplifier circuit according to claim 2, wherein said output potential maintaining means comprises an MOS transistor receiving said first predetermined potential at a drain electrode, and having a source electrode and a gate electrode connected to said output data line and said output node, respectively.

5. The amplifier circuit according to claim 3, wherein said reference potential is said first predetermined potential.

6. The amplifier circuit according to claim 3, wherein said MOS transistor is an N channel MOS transistor.

7. The amplifier circuit according to claim 3, wherein said MOS transistor is a P channel MOS transistor.

8. A complementary amplifier circuit receiving complementary input signals corresponding to data read out from a memory cell for providing corresponding complementary output signals to a first output data line and a second output data line in a dynamic semiconductor memory device, said complementary amplifier circuit comprising:

complementary differential amplifier means receiving said complementary input signals, and including first and second output nodes for providing corresponding first and second potentials complementary to each other, precharge means responsive to a precharge signal for setting potentials of said first and second output data lines at a first predetermined potential, first output potential limiting means connected between said first output node and said first output data line, second output potential limiting means connected between said second output node and said second output data line, wherein said first and second output potential limiting means receive a potential of said first output node and a potential of said second output node, respectively, to be rendered conductive when a difference between a potential of a corresponding output node and said first predetermined potential exceeds a predetermined value, and first output potential maintaining means responsive to the potential of said second output node attaining said second potential for maintaining a potential of said first output data line at a second predetermined potential, and second output potential maintaining means responsive to a potential of said first output node attaining said second potential for maintaining the potential of said second output data line at said second predetermined potential.

9. The complementary amplifier circuit according to claim 8, wherein said first output potential limiting means comprises a first MOS transistor connected between said first output node and said first output data line for receiving a reference potential at a gate electrode, and said second output potential limiting means comprises a second MOS transistor connected between said second output node and said second output data line for receiving a reference potential at the gate electrode.

10. The complementary amplifier circuit according to claim 8, wherein said first output potential maintaining means comprises a third MOS transistor receiving said first predetermined potential at a drain electrode and having a source electrode and a gate electrode connected to said first output data line and said second output node, respectively, and said first output potential maintaining means comprises a fourth MOS transistor receiving said first predetermined potential at its drain, and having its source and gate connected to said second output data line and said first output node, respectively.

11. The complementary amplifier circuit according to claim 9, wherein said reference potential is said first predetermined potential.

12. The complementary amplifier circuit according to claim 9, wherein said first and second MOS transistors are N channel MOS transistors.

13. The complementary amplifier circuit according to claim 9, wherein said first and second MOS transistors are P channel MOS transistors.

14. The complementary amplifier circuit according to claim 10, wherein said third and fourth MOS transistors are N channel MOS transistors.

15. The complementary amplifier circuit according to claim 10, wherein said third and fourth MOS transistors are P channel MOS transistors.

16. An amplifier circuit receiving an input signal corresponding to data read out from a memory cell for providing a corresponding output signal to an output data line in a dynamic semiconductor memory device, said amplifier circuit comprising:

a plurality of stages of cascade-connected internal amplifier means receiving said input signal and providing an amplified signal as said output signal, and output potential limiting means connected between at least one pair of said plurality of stages of internal amplifier means to be rendered conductive when a difference between an output potential of an internal amplifier means of a preceding stage and a predetermined potential exceeds a predetermined value.

* * * * *

UNITED STATES PATENT AND TRADEMARK OFFICE
CERTIFICATE OF CORRECTION

PATENT NO. : 5,757,711
DATED : May 26, 1998
INVENTOR(S) : Yoshito NARAOKA et al.

It is certified that error appears in the above-identified patent and that said Letters Patent is hereby corrected as shown below:

Column 15, line 26
Claim 9, line 10, change "a" to --the--.

Column 15, line 35
Claim 10, line 9, change "first" to --second--.

Signed and Sealed this

Twenty-fourth Day of November, 1998

Attest:

BRUCE LEHMAN

*Attesting Officer*  Commissioner of Patents and Trademarks